(12) United States Patent
Kuo et al.

(10) Patent No.: US 11,257,898 B2
(45) Date of Patent: Feb. 22, 2022

(54) SYSTEMS AND METHODS FOR SHIELDED INDUCTIVE DEVICES

(71) Applicant: Taiwan Semiconductor Manufacturing Co., Ltd., Hsinchu (TW)

(72) Inventors: Feng Wei Kuo, Hsinchu County (TW); Chewn-Pu Jou, Hsinchu (TW); Huan-Neng Chen, Hsin-Chu (TW); Lan-Chou Cho, Hsinchu (TW); Robert Bogdan Staszewski, Dublin (IE)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/908,237

(22) Filed: Jun. 22, 2020

(65) Prior Publication Data

US 2020/0317555 A1   Oct. 8, 2020

Related U.S. Application Data

(62) Division of application No. 15/965,476, filed on Apr. 27, 2018, now Pat. No. 10,692,963.
(Continued)

(51) Int. Cl.
*H01L 49/02* (2006.01)
*H01L 23/522* (2006.01)
(Continued)

(52) U.S. Cl.
CPC ............ *H01L 28/10* (2013.01); *B01D 1/0017* (2013.01); *B01D 1/12* (2013.01); *C02F 1/048* (2013.01); *C02F 11/12* (2013.01); *C02F 11/18* (2013.01); *H01F 27/2885* (2013.01); *H01L 23/5227* (2013.01); *H03L 7/085* (2013.01); *H03L 7/099* (2013.01); *C02F 2101/301* (2013.01); *C02F 2101/306* (2013.01); *C02F 2103/14* (2013.01); *C02F 2103/16* (2013.01); *C02F 2103/28* (2013.01); *C02F 2103/32* (2013.01); *C02F 2103/343* (2013.01); *C02F 2103/365* (2013.01); *H03L 2207/50* (2013.01)

(58) Field of Classification Search
CPC ...... H01L 28/10; H01L 23/5527; C02F 11/12; C02F 11/18; C02F 1/048; C02F 2101/301; C02F 2101/306; C02F 2103/14; C02F 2103/16; C02F 2103/28; C02F 2103/32; C02F 2103/343; C02F 2103/365; B01D 1/0017; B01D 1/12; H01F 27/2885; H03L 7/085; H03L 7/099; H03L 2207/50
USPC .................................................. 257/531, 421
See application file for complete search history.

(56) References Cited

U.S. PATENT DOCUMENTS

2004/0113737 A1   6/2004   Zhang
2004/0195651 A1   6/2004   Zhang
(Continued)

*Primary Examiner* — Igwe U Anya
(74) *Attorney, Agent, or Firm* — Duane Morris LLP

(57) ABSTRACT

In an embodiment, a circuit includes: a transformer defining an inductive footprint within a first layer; a grounded shield bounded by the inductive footprint within a second layer separate from the first layer; and a circuit component bounded by the inductive footprint within a third layer separate from the second layer, wherein: the circuit component is coupled with the transformer through the second layer, and the third layer is separated from the first layer by the second layer.

20 Claims, 8 Drawing Sheets

Related U.S. Application Data

(60) Provisional application No. 62/624,003, filed on Jan. 30, 2018.

(51) Int. Cl.

| | | |
|---|---|---|
| *H01F 27/28* | (2006.01) |
| *H03L 7/085* | (2006.01) |
| *H03L 7/099* | (2006.01) |
| *B01D 1/00* | (2006.01) |
| *B01D 1/12* | (2006.01) |
| *C02F 1/04* | (2006.01) |
| *C02F 11/12* | (2019.01) |
| *C02F 11/18* | (2006.01) |
| *C02F 101/30* | (2006.01) |
| *C02F 103/14* | (2006.01) |
| *C02F 103/16* | (2006.01) |
| *C02F 103/28* | (2006.01) |
| *C02F 103/32* | (2006.01) |
| *C02F 103/34* | (2006.01) |
| *C02F 103/36* | (2006.01) |

(56) References Cited

U.S. PATENT DOCUMENTS

| | | |
|---|---|---|
| 2005/0128038 A1* | 6/2005 | Hyvonen ............ H01L 23/5225 336/182 |
| 2006/0049481 A1 | 3/2006 | Tiemeijer |
| 2007/0097010 A1* | 5/2007 | Mohamadi ............... H01Q 1/38 343/795 |
| 2008/0012091 A1* | 1/2008 | Ding ........................ H03J 3/20 257/531 |
| 2012/0187530 A1 | 7/2012 | Zhang |
| 2012/0286391 A1 | 11/2012 | Shen |
| 2013/0147023 A1 | 6/2013 | Lin |
| 2014/0117496 A1 | 5/2014 | Cheng |
| 2014/0361401 A1 | 12/2014 | Wang |
| 2015/0263082 A1 | 9/2015 | Ler |
| 2016/0148929 A1* | 5/2016 | Lee .................... H01L 27/0288 257/531 |
| 2017/0207293 A1 | 7/2017 | Song et al. |
| 2018/0033537 A1* | 2/2018 | Kim ................. H01L 23/49822 |
| 2018/0190584 A1 | 7/2018 | Upadhyaya |

* cited by examiner

SYSTEMS AND METHODS FOR SHIELDED INDUCTIVE DEVICES

CROSS-REFERENCE TO RELATED APPLICATION

This application is a division of U.S. patent application Ser. No. 15/964,476 filed Apr. 27, 2018 which claims priority to U.S. Provisional Patent Application No. 62/624,003, filed on Jan. 30, 2018, each of which are incorporated by reference herein in their entireties.

BACKGROUND

Mobile devices, such as smart phones, tablets, Internet of Things (IoT), etc., may include an integrated circuit with various circuit components connected via a plurality of interconnects, such as traces, pads, and/or vias. An example of a circuit component may include an inductor. However, inductors may take up a relatively greater amount of real estate on the integrated circuit than other circuit components, such as voltage dividers, buffers, resistors, transistors, capacitors, or other active or passive devices. Accordingly, producing integrated circuits with a compact form factor, while at the same time meeting the needs and/or requirements of mobile devices, may be more difficult when inductors are utilized as part of an integrated circuit.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
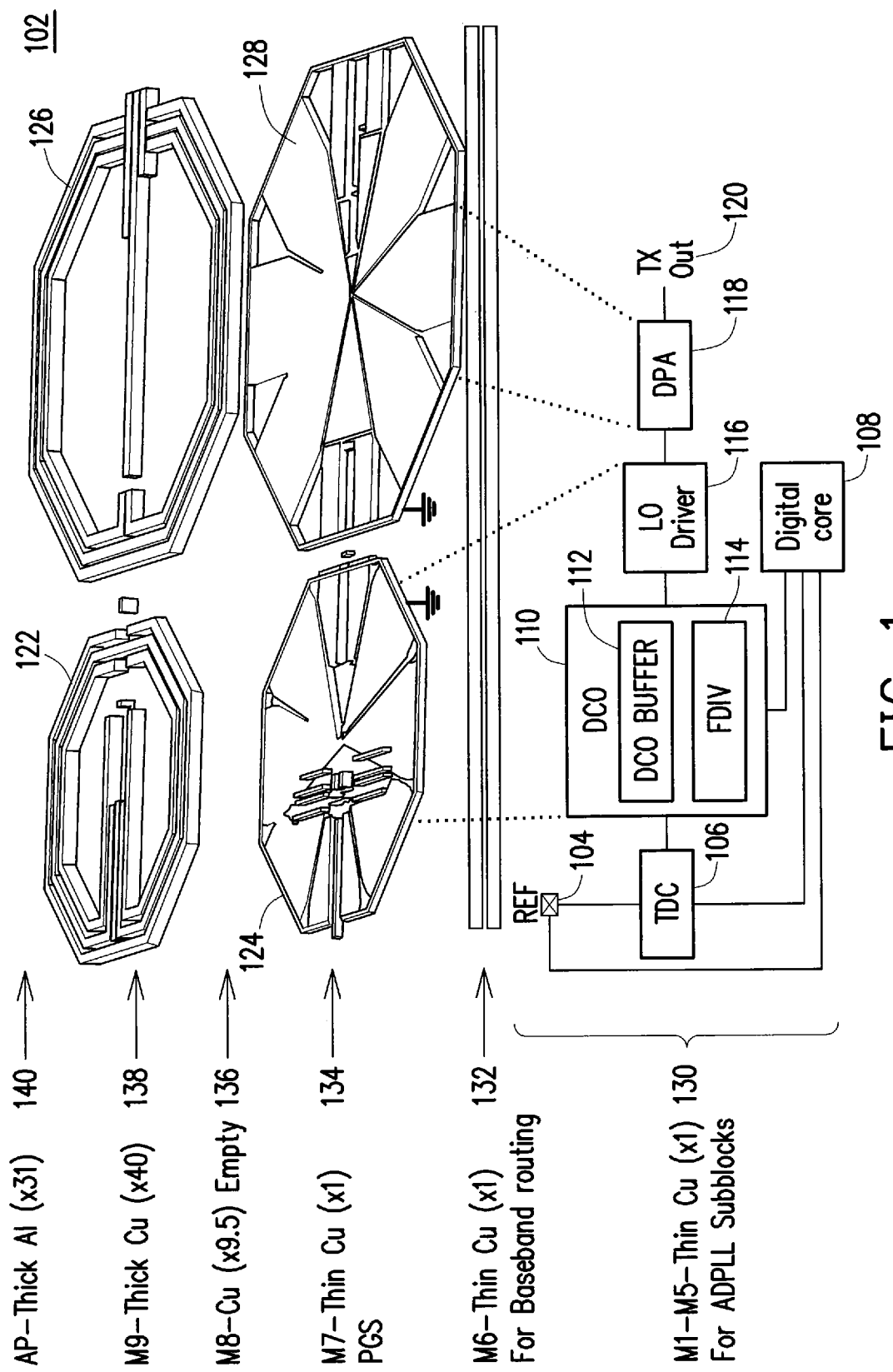
FIG. 1 is an illustration of various layers of an integrated circuit with shielded inductive devices as part of an all-digital phase lock loop (ADPLL), in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of shielded inductive devices. A shielded inductive device may include an inductive circuit component that is separated from non-inductive circuit components by a grounded shield. Each of the grounded shield, non-inductive circuit component(s), and the inductive circuit component may be laterally bound within an inductive footprint of the inductive circuit component.

As introduced above, a circuit component may represent any discrete component of a circuit, such as inductors, transformers, voltage dividers, buffers, resistors, transistors, capacitors, and the like. The inductive circuit component may be referred to as an inductive component and the non-inductive circuit components may be referred to as non-inductive components for brevity. The inductive component may be a circuit component of at least one inductor, such as an inductor or a transformer. Likewise, the non-inductive component may include circuit components other than an inductor. The inductive component may also define an inductive footprint, which is a lateral area or extension of the inductive component. A lateral extension may refer to a direction or extension that is orthogonal to a vertical extension on which the number of layers (e.g., metallization layers) of an integrated circuit, or device, may be increased. Both the inductive shield and the non-inductive components of the shielded inductive device may be bounded within the inductive footprint (e.g., surrounded laterally by the extremities of the inductive footprint). In certain embodiments, all non-inductive components that connect or couple directly with the inductive component may be bounded within the inductive footprint.

Accordingly, a shielded inductive device may occupy a small footprint by having all of the constituent circuit components bounded by the inductive footprint of the inductive component. As noted above, the inductive component may be the largest or among the largest circuit component by lateral area. However, traditional circuit design may have non-inductive components laterally separated from such an inductive component in order to avoid crosstalk or interference from the various circuit components of a device with the inductive component. However, shielded inductive devices may avoid the cross talk or interference from non-inductive components while enjoying a reduced lateral footprint, instead of a traditionally expanded lateral footprint.

These shielded inductive devices may be utilized in any device that may include an inductive component (e.g., an inductor or transformer), such as a frequency synthesizer, phase lock loop, oscillator, amplifier, and the like. Also, such shielded inductive devices may perform as well as or similar to non-shielded inductive devices (e.g., devices with an inductive component but without a grounded shield and not bound within an inductive footprint), as measured by quality factor versus operational frequency. However, shielded inductive devices would have a much smaller fabrication area due to being constrained within the inductive footprint.

FIG. 1 is an illustration of various layers of an integrated circuit with shielded inductive devices as part of an all-digital phase lock loop (ADPLL) 102, in accordance with some embodiments. ADPLLs are conventional and will not be discussed in detail. However, the ADPLL 102 may include a reference (REF) 104, a time to digital converter (TDC) 106, a digital core 108, a digitally controlled oscillator (DCO) 110 (which, in certain embodiments, includes a DCO buffer 112 and a DCO divider (FDIV) 114), a driver (LO Driver) 116, and a digital power amplifier (DPA) 118. The DPA 118 may be coupled with an output transmitter 120. The DCO 110 may be implemented as a shielded inductive device to include a DCO inductive component 122 separated from the non-inductive components by a DCO grounded shield 124. Similarly, the DPA 118 may be implemented as a shielded inductive device to include a DPA inductive component 126 separated from the non-inductive components of the DPA by a DPA grounded shield 128. Each of the DCO inductive component 122 and the DPA inductive component 126 may be transformers, formed of multiple inductors. Also, although the DCO grounded shield 124 and the DPA grounded shield 128 may be illustrated with open spaces between parts of grounded conductive material, in certain embodiments a grounded shield may be entirely or substantially simply connected (e.g., without holes or open spaces between parts of grounded conductive material). A simply connected topological space may be without any holes that pass all the way through the simply connected topological space.

Each of the parts of the ADPLL 102 may be implemented on an integrated circuit in metallization layers. For example, non-inductive components may be implemented within the first to fifth metallization layer 130 with copper (Cu). A baseband routing layer may be implemented in the sixth metallization layer 132 with copper (Cu). The DPA grounded shield 128 and the DCO grounded shield 124 may be implemented in the seventh metallization layer 134 with copper (Cu). An eighth metallization layer 136 with copper (Cu) may be substantially empty for the purposes of the ADPLL 102. The ninth metallization layer 138 may be implemented with the DCO inductive component 122 and the DPA inductive component 126. An uppermost aluminum layer (AP) 140 may be above the ninth metallization layer 138. Each of the first to seventh metallization layers may have substantially uniform thickness. However, the eighth metallization layer 136 may be 8-12 (e.g., 9.5) times thicker, the ninth metallization layer 138 may be 30-50 (e.g., 40) times thicker and the AP layer 140 may be 20-40 (e.g., 31) times thicker than each of the first to seventh metallization layers.

Figure 2A:
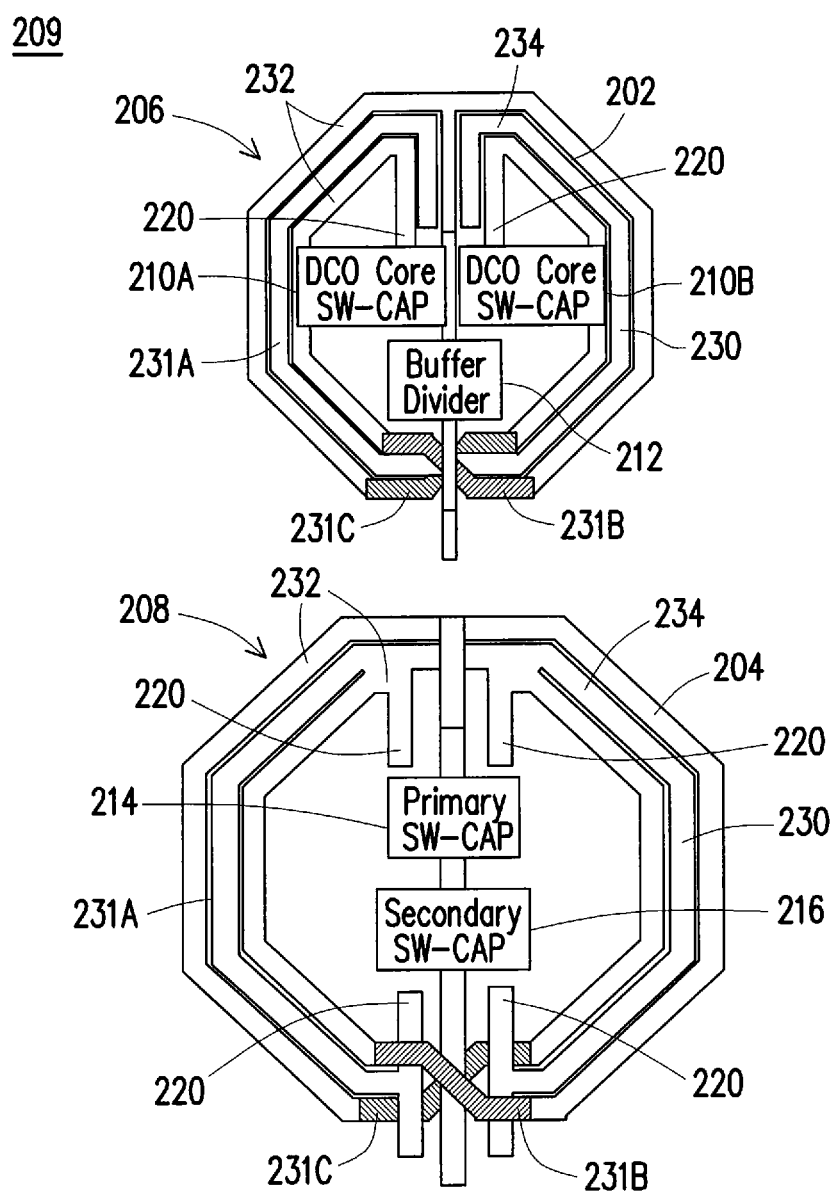
FIG. 2A is an illustration of an oscillator inductive component and an amplifier inductive component relative to other non-inductive components of respective shielded inductive devices, in accordance with some embodiments.

FIG. 2A is an illustration of an oscillator inductive component 202 and an amplifier inductive component 204 relative to other non-inductive components of respective shielded inductive devices 206, 208, in accordance with some embodiments. The respective shielded inductive devices 206, 208 may be part of an ADPLL 209, discussed further above. Also, the respective inductive components may be transformers for each respective shielded inductive device 206, 208. For example, the oscillator inductive component 202 may be part of an oscillator shielded inductive device 206 (e.g., an oscillator that is also a shielded inductive device) and the amplifier inductive component 204 may be part of an amplifier shielded inductive device 208 (e.g., an amplifier that is also a shielded inductive device).

Furthermore, respective non-inductive components of each shielded inductive device 206, 208 may be bound within an inductive footprint of each respective inductive component 202, 204. For example, the non-inductive components for the oscillator shielded inductive device 206 may include two core capacitors 210A, 210B and a combined buffer and divider 212. Also, the non-inductive components for the amplifier shielded inductive device 208 may include a primary capacitor 214 and a secondary capacitor 216. The various non-inductive components may be within the inductive footprint defined by their respective inductive components. The inductive footprint may be defined by the lateral extent of each respective inductive component. Stated another way, the inductive footprint of each respective inductive component 202, 204 may be the octagonal shape formed by the outer lateral bounds of each respective inductive component 202, 204. In certain embodiments, the various non-inductive components may be within the inductive footprint defined by their respective inductive components and within the physical windings of their respective inductive components. For example, ports 220 at each respective inductive components may face inward from the physical windings to face and interface with each non-inductive component.

The physical structure of the respective inductive components may be formed within and among various metallization layers, as discussed above. For example, the oscillator inductive component 202 and the amplifier inductive component 204 may be substantially formed within a single metallization layer, with particular parts of the windings at other layers to effectuate the winding structure. For example, a main winding structure 230 may refer to a substantial part of either the oscillator inductive component 202 and/or the amplifier inductive component 204. The main winding structure may be within a single metallization layer, termed as a primary metallization layer 231A. Each of the oscillator inductive component 202 and the amplifier inductive component 204 may be a transformer of multiple inductors. Accordingly, for each of the oscillator inductive component 202 and the amplifier inductive component 204, a first winding of a first inductor 232 may be connected to a second winding of the first inductor 232 utilizing transition windings at a secondary metallization layer 231B and/or a tertiary metallization layer 231C. Each of the primary metallization layer 231A, secondary metallization layer 231B and the tertiary metallization layer 231C may be different metallization layers. The first inductor 232 may generally surround a second inductor 234 all within the primary metallization layer 231A. In certain embodiments, the primary metallization layer 231A may be the ninth metallization layer (discussed above in connection with FIG. 1) and the secondary metallization layer 231B may be the AP layer (discussed above in connection with FIG. 1) and the tertiary metallization layer 231C may be the eighth metallization layer (discussed above in connection with FIG. 1).

In various embodiments, the physical structure of the respective inductive components may be formed within and among various redistribution metallization layers of an integrate fan out (InFO) package. InFO packages are conventional and will not be discussed in detail herein. The InFo packages may include a first redistribution layer (RDL1), a second redistribution layer (RDL2), and a third redistribution layer (RDL3). Accordingly, as one example, the primary metallization layer 231A may be the RDL1 and the secondary metallization layer 231B may be the RDL2 and the tertiary metallization layer 231C may be the RDL3. As another example, the primary metallization layer 231A may be the RDL3 and the secondary metallization layer 231B may be the RDL2 and the tertiary metallization layer 231C may be the RDL1.

Figure 2B:
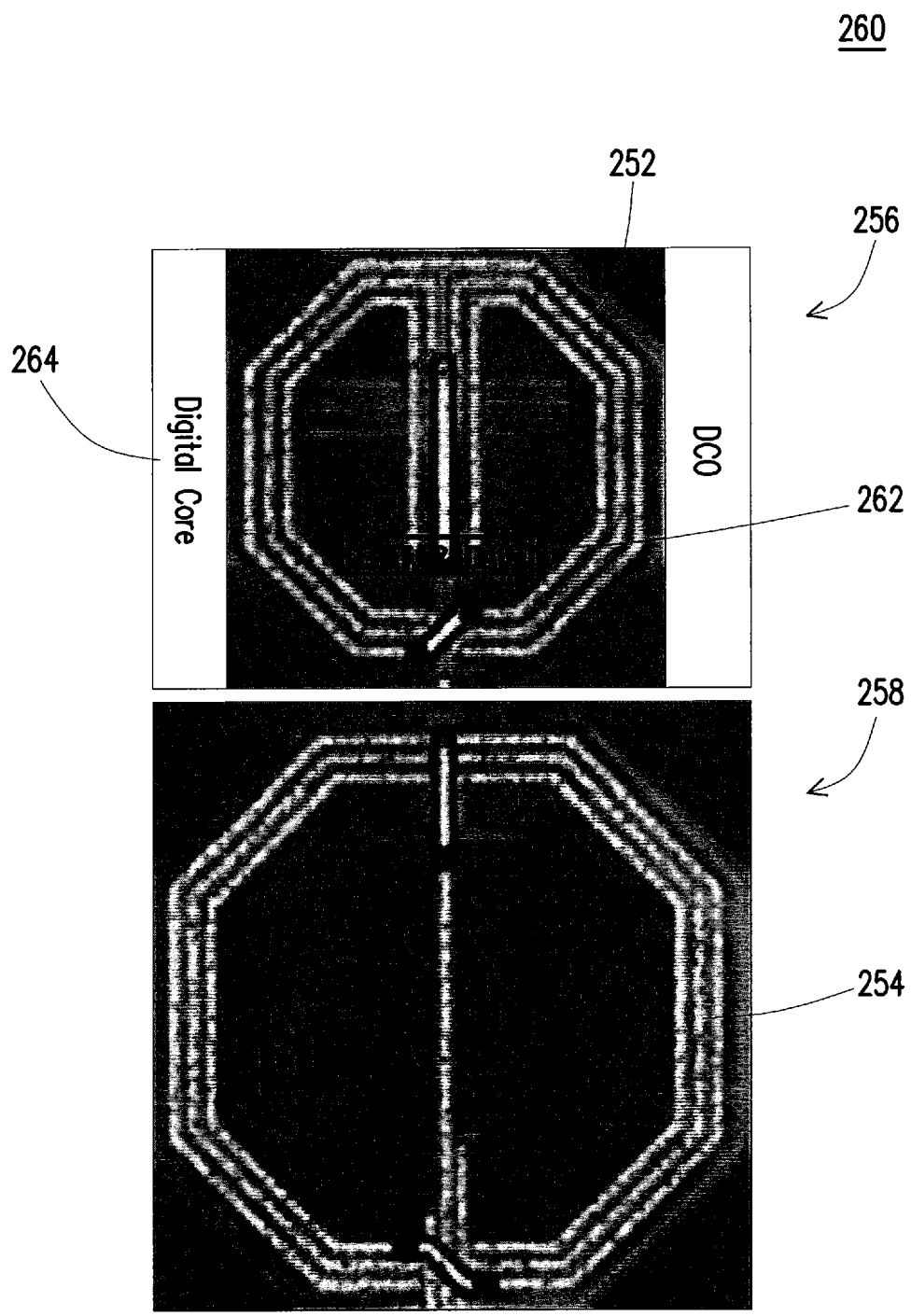
FIG. 2B is an illustration of an oscillator inductive component and an amplifier inductive component relative to other non-inductive components of respective shielded inductive devices of an ADPLL, in accordance with some embodiments.

FIG. 2B is an illustration of an oscillator inductive component 252 and an amplifier inductive component 254 relative to other non-inductive components of respective shielded inductive devices 256, 258 of an ADPLL 260, in accordance with some embodiments. Various non-inductive components such as a buffer and divider may be within the inductive footprint of an inductive component 252, 254. For example, a buffer and divider 262 may be within an inductive footprint of the oscillator inductive component 252. However, certain non-inductive components of the ADPLL 260 that includes the respective shielded inductive devices 256, 258 may be outside of the inductive footprint of an inductive component 252, 254. For example, the digital core of the ADPLL 264 may be outside of the inductive the inductive footprint of an inductive component 252, 254.

Figure 3A:
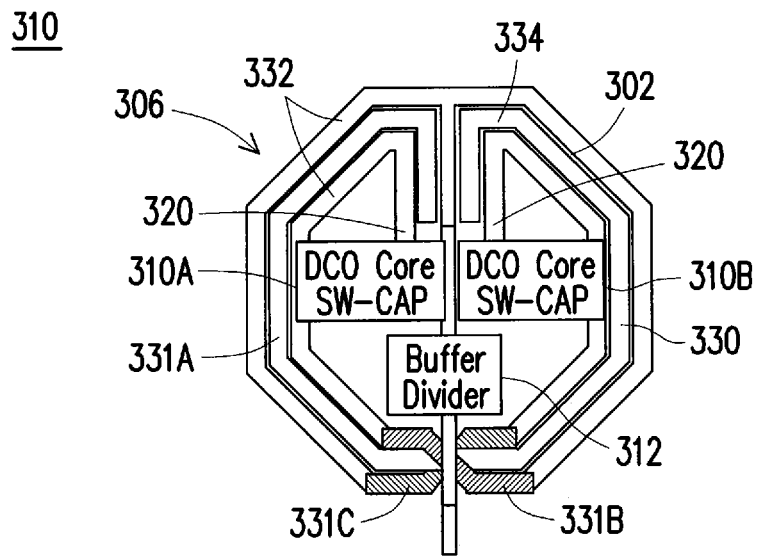
FIG. 3A is an illustration of an oscillator inductive component relative to other non-inductive components of an oscillator shielded inductive device, in accordance with some embodiments.

FIG. 3A is an illustration of an oscillator inductive component 302 relative to other non-inductive components of an oscillator shielded inductive device 306, in accordance with some embodiments. Respective non-inductive components of the oscillator shielded inductive device 306, may be bound within an inductive footprint the oscillator inductive component 302. For example, the non-inductive components for the oscillator shielded inductive device 306 may include two core capacitors 310A, 310B and a combined buffer and divider 312. The various non-inductive components may be within the inductive footprint defined by the oscillator inductive component 302 (e.g., the lateral extent of the oscillator inductive component 302). In certain embodiments, the various non-inductive components may be within the inductive footprint defined by the oscillator inductive component 302 and within the physical windings of the oscillator inductive component 302. For example, ports 320 at the oscillator inductive component 302 may face inward from the physical windings to face and interface with each non-inductive component.

The physical structure of the oscillator inductive component 302 may be formed within and among various metallization layers, as discussed above. For example, the oscillator inductive component 302 may be substantially formed within a single metallization layer, with particular parts of the windings at other layers to effectuate the winding structure. For example, a main winding structure 330 may refer to a substantial part the oscillator inductive component 302. The main winding structure may be within a single metallization layer that will be referred to as a primary metallization layer 331A. Also, the oscillator inductive component 302 may be a transformer of multiple inductors. Accordingly, for the oscillator inductive component 302, a first winding of a first inductor 332 of a main winding structure may be connected to a second winding of the first inductor 332 utilizing transition windings at a secondary metallization layer 331B and/or a tertiary metallization layer 331C. The primary metallization layer 331A, secondary metallization layer 331B and the tertiary metallization layer 331C may be different metallization layers. Also, the first inductor 332 may generally surround a second inductor 334 within the primary metallization layer 331A. In certain embodiments, the primary metallization layer 331A may be the ninth metallization layer (discussed above in connection with FIG. 1) and the secondary metallization layer 331B may be the AP layer (discussed above in connection with FIG. 1) and the tertiary metallization layer 331C may be the eighth metallization layer (discussed above in connection with FIG. 1).

In various embodiments, the physical structure of the respective inductive components may be formed within and among various redistribution metallization layers of an integrate fan out (InFO) package. The InFo packages may include a first redistribution layer (RDL1), a second redistribution layer (RDL2), and a third redistribution layer (RDL3). Accordingly, as one example, the primary metallization layer 331A may be the RDL1 and the secondary metallization layer 331B may be the RDL2 and the tertiary metallization layer 331C may be the RDL2. As another example, the primary metallization layer 331A may be the RDL3 and the secondary metallization layer 331B may be the RDL2 and the tertiary metallization layer 331C may be the RDL1.

Figure 3B:
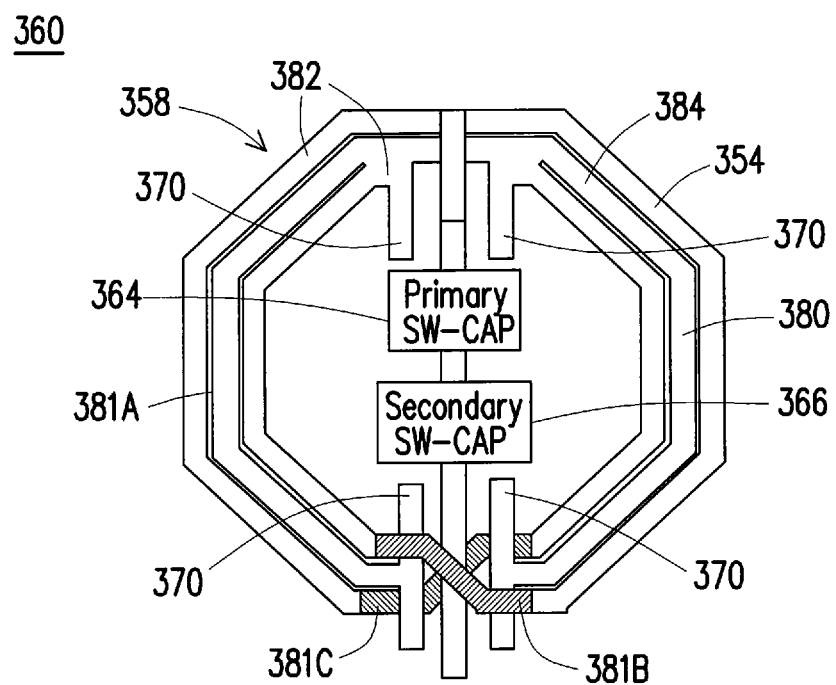
FIG. 3B is an illustration of an amplifier inductive component relative to other non-inductive components of an amplifier shielded inductive device, in accordance with some embodiments.

FIG. 3B is an illustration of an amplifier inductive component 354 relative to other non-inductive components of an amplifier shielded inductive device 358, in accordance with some embodiments. Respective non-inductive components of the amplifier shielded inductive device 358, may be bound within an inductive footprint the amplifier inductive component 354. For example, the non-inductive components for the amplifier shielded inductive device 358 may include a primary capacitor 364 and a secondary capacitor 366. The various non-inductive components may be within the inductive footprint defined by the amplifier inductive component 354 (e.g., the lateral extent of the amplifier inductive component 354). In certain embodiments, the various non-inductive components may be within the inductive footprint defined by the amplifier inductive component 354 and within the physical windings of the amplifier inductive component 354. For example, ports 370 at the amplifier inductive component 354 may face inward from the physical windings to face and interface with the non-inductive components.

The physical structure of the amplifier inductive component 354 may be formed within and among various metallization layers, as discussed above. For example, the amplifier inductive component 354 may be substantially formed within a single metallization layer, with particular parts of the windings at other layers to effectuate the winding structure. For example, a main winding structure 380 may refer to a substantial part the amplifier inductive component 354. The main winding structure may be within a single metallization layer, termed as a primary metallization layer 381A. Also, the amplifier inductive component 354 may be a transformer of multiple inductors. Accordingly, for the amplifier inductive component 354, a first winding of a first inductor 382 of a main winding structure may be connected to a second winding of the first inductor 382 utilizing transition windings at a secondary metallization layer 381B and/or a tertiary metallization layer 381C. The primary metallization layer 381A, secondary metallization layer 381B and the tertiary metallization layer 381C may be different metallization layers. Also, the first inductor 382 may generally surround a second inductor 384 within the primary metallization layer 381A. In certain embodiments, the primary metallization layer 381A may be the ninth metallization layer (discussed above in connection with FIG. 1) and the secondary metallization layer 381B may be the AP layer (discussed above in connection with FIG. 1) and the tertiary metallization layer 381C may be the eighth metallization layer (discussed above in connection with FIG. 1).

In various embodiments, the physical structure of the respective inductive components may be formed within and among various redistribution metallization layers of an integrate fan out (InFO) package. The InFo packages may include a first redistribution layer (RDL1), a second redistribution layer (RDL2), and a third redistribution layer (RDL3). Accordingly, as one example, the primary metallization layer 381A may be the RDL1 and the secondary metallization layer 381B may be the RDL2 and the tertiary metallization layer 381C may be the RDL3. As another example, the primary metallization layer 381A may be the RDL3 and the secondary metallization layer 381B may be the RDL2 and the tertiary metallization layer 381C may be the RDL1.

Figure 4:
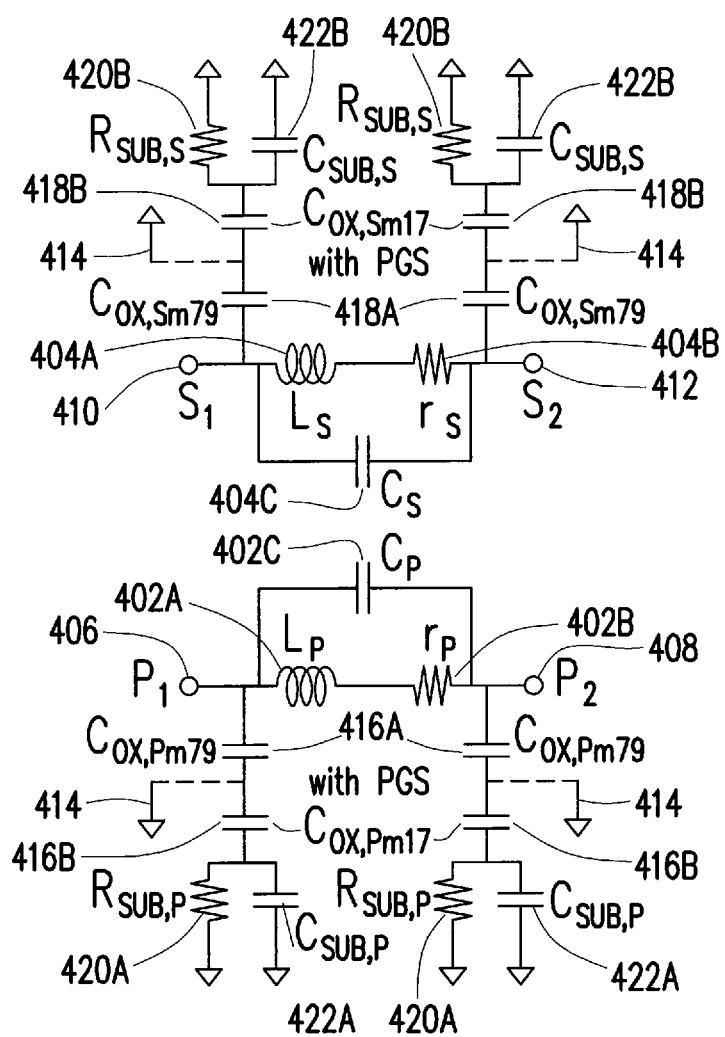
FIG. 4 is a circuit diagram of a transformer that may be implemented in a shielded inductive device, in accordance with some embodiments.

FIG. 4 is a circuit diagram of a transformer 400 that may be implemented in a shielded inductive device, in accordance with some embodiments. The transformer 400 may include a primary inductor ($L_P$) 402A and a secondary inductor ($L_S$) 404A. Resistance and capacitance associated with the primary inductor ($L_P$) 402A may be represented as a primary resistor ($r_P$) 402B and a primary capacitor ($C_P$) 402C connected in parallel with the primary inductor ($L_P$) 402A and primary resistor ($r_P$) 402B. Similarly, resistance and capacitance associated with the secondary inductor ($L_S$) 404A may be represented as a secondary resistor ($r_S$) 404B and a secondary capacitor ($C_S$) 404C connected in parallel with the secondary inductor ($L_S$) 404A and the secondary resistor ($r_S$) 404B. A first primary port ($P_1$) 406 may be coupled with the primary inductor ($L_P$) 402A and the primary capacitor ($C_P$) 402C. A second primary port ($P_2$) 408 may be coupled with the primary resistor ($r_P$) 402B and the primary capacitor ($C_P$) 402C. A first secondary port ($S_1$) 410 may be coupled with the secondary inductor ($L_S$) 404A and the secondary capacitor ($C_S$) 404C. A second secondary port ($S_2$) 412 may be coupled with the secondary resistor ($r_S$) 404B and the secondary capacitor ($C_S$) 404C.

Certain aspects of FIG. 4 may be implemented within the context of the metallization layers of FIG. 1. Accordingly, certain aspects of FIG. 4 will now be discussed with reference to the metallization layers of FIG. 1. Due to the addition of the grounded shield 414, also referred to as power ground shielding (PGS) 414, capacitance across the layers Cox (discussed above in connection with FIG. 1) may be divided into capacitance across the primary components between metallization layer 7 and metallization layer 9 and between metallization layer 1 and metallization layer 7 (with the metallization layers discussed above in connection with FIG. 1). This may be expressed at the first primary port ($P_1$) 406 and the second primary port ($P_2$) 408 as capacitor ($C_{OX}$,$Pm_{79}$) 416A and capacitor ($C_{OX}$,$Pm_{17}$) 416B. Also, this may be expressed at the first secondary port ($S_1$) 410 and the second secondary port ($S_2$) 412 as capacitor ($C_{OX}$,$Sm_{79}$) 418A and ($C_{OX}$,$Sm_{17}$) 418B.

The substrate below the first metallization layer (discussed above in connection with FIG. 1) may be represented in interaction with the capacitor ($C_{OX}$,$Pm_{17}$) 418B as an amount of resistance, represented by resistor ($R_{SUB,P}$) 420A associated with the primary inductor ($L_P$) 402A, and resistor ($R_{SUB,S}$) 420B associated with the secondary inductor ($L_S$) 404A. Also, the substrate below the first metallization layer (discussed above in connection with FIG. 1) may be represented in interaction with the capacitor ($C_{OX}$,$Pm_{17}$) 418B as an amount of capacitance, represented by capacitor ($C_{SUB,P}$) 422A in parallel with the resistor ($R_{SUB,P}$) 420A associated with the primary inductor ($L_P$) 402A and capacitor ($C_{SUB,S}$) 422B in parallel with resistor ($R_{SUB,S}$) 420B associated with the secondary inductor ($L_S$) 404A.

Figure 5B:
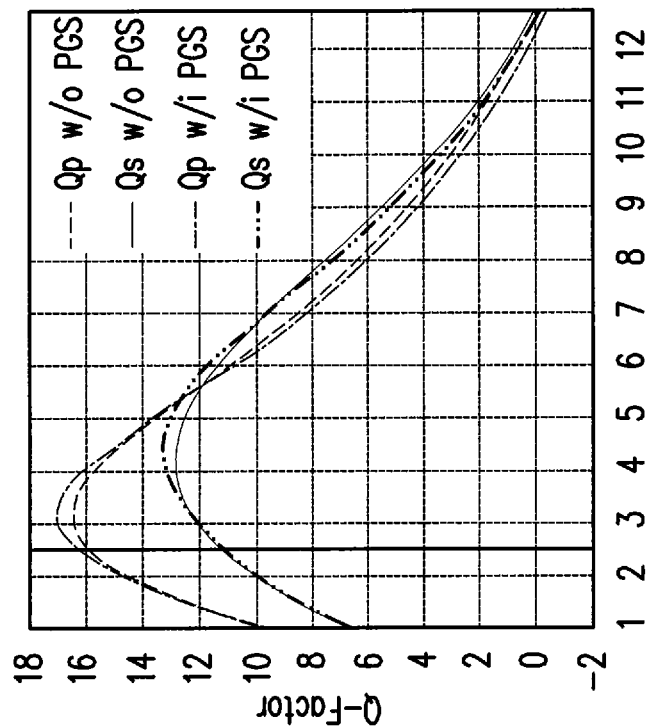
FIG. 5B is a plot of Q factor versus frequency for an amplifier with a shielded inductive device, in accordance with some embodiments.
Figure 5A:
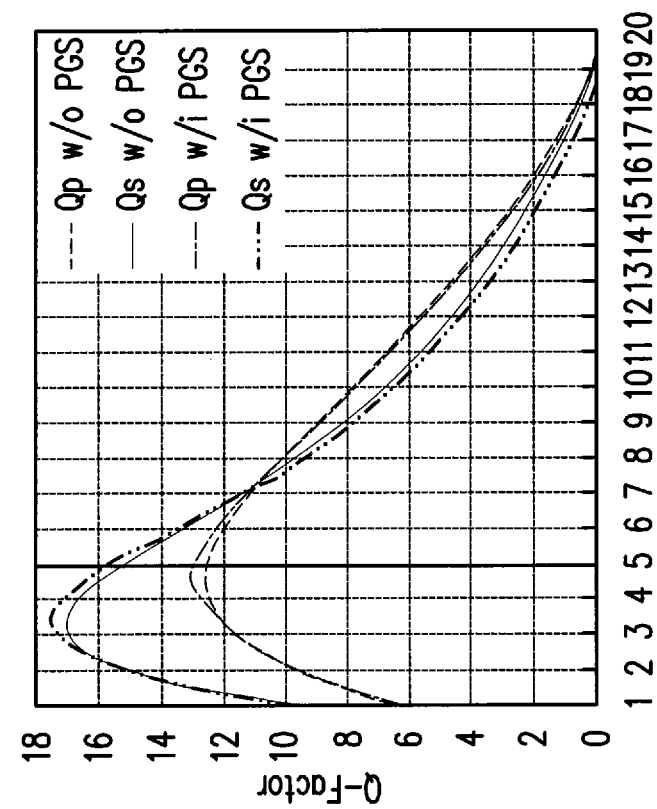
FIG. 5A is a plot of Q factor versus frequency for an oscillator with a shielded inductive device, in accordance with some embodiments.

FIG. 5A is a plot of quality factor (e.g., Q-factor) versus frequency for an oscillator with a shielded inductive device, in accordance with some embodiments. The shielded inductive device is a transformer and the oscillator is a digitally controlled oscillator. Also, the notation "w/o PGS" indicates a device with a transformer without a grounded shield and "w/I PGS" indicates a shielded inductive device with a grounded shield. As noted in FIG. 5A, the quality factors (e.g., Q-Factor) of the oscillator is generally consistent either with or without a grounded shield. Therefore, the utilization of a grounded shield does not significantly detriment the Q-Factor of a shielded inductive device.

FIG. 5B is a plot of quality factor (e.g., Q-factor) versus frequency for an amplifier with a shielded inductive device, in accordance with some embodiments. The shielded inductive device is a transformer and the amplifier is a digital power amplifier. Also, the notation "w/o PGS" indicates a device with a transformer without a grounded shield and "w/I PGS" indicates a shielded inductive device with a grounded shield. As noted in FIG. 5A, the quality factor (e.g., Q-Factor) of the amplifier is generally consistent either with or without a grounded shield. Therefore, the utilization of a grounded shield does not significantly detriment the Q-Factor of a shielded inductive device.

Figure 6:
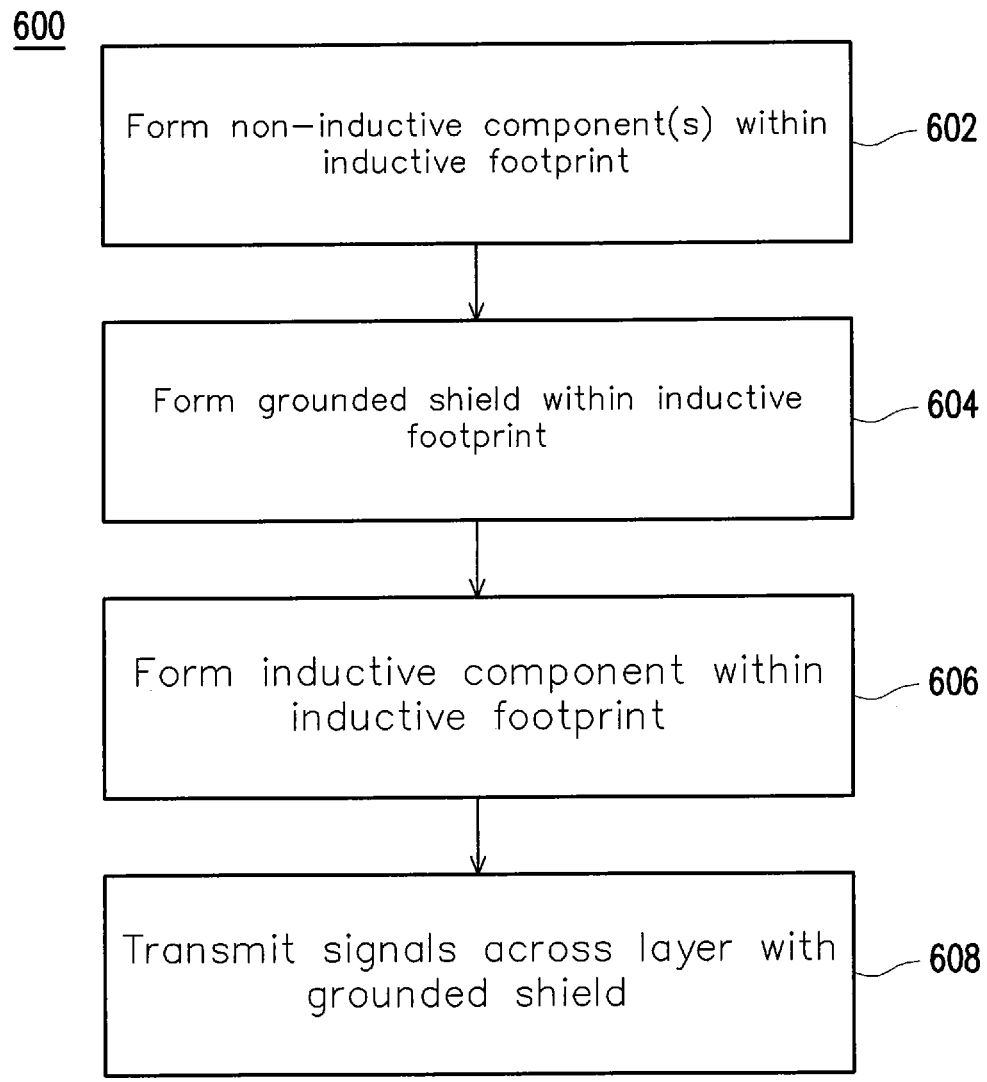
FIG. 6 is a flow chart of a shielded inductive device process, in accordance with some embodiments.

FIG. 6 is a flow chart of a shielded inductive device process 600, in accordance with some embodiments. It is noted that the process 600 is merely an example, and is not intended to limit the present disclosure. Accordingly, it is understood that additional operations may be provided before, during, and after the process 600 of FIG. 6, certain operations may be omitted, certain operations may be performed concurrently with other operations, and that some other operations may only be briefly described herein.

At operation 602, non-inductive components may be formed within an inductive footprint. The inductive footprint may be a predetermined lateral area within which the inductive device of operation 606, discussed below, is to occupy. Returning to operation 602, the non-inductive components, and each of the inductive components and the grounded shield referenced below, may be formed within a plurality of metallization layers. These metallization layers may be sequentially formed such that the layers rest on each other. Various techniques for the formation of metallization layers and their constituent circuit components may be conventional and will not be discussed in detail herein for brevity. In certain embodiments, as discussed in certain examples above, the metallization layers and non-inductive components may be formed above a substrate on which the metallization layers are formed.

At operation 604 a grounded shield may be formed within the inductive footprint. The grounded shield may be formed in a layer between the non-inductive components and the inductive component to be formed in operation 606. Returning to operation 604, the grounded shield may be a layer of grounded conductive material laterally bound by the predetermined inductive footprint. The grounded shield may shield the inductive component from interference from the various non-inductive components of the shielded inductive device formed by process 600. The metallization layer that includes the grounded shield may be different than the layers that include the non-inductive components. For example, the metallization layer that includes the grounded shield may be atop or formed above the metallization layers that include the non-inductive components.

In operation 606, the inductive component may be formed within the predetermined inductive footprint. The inductive component may be a circuit component that includes one or more inductors. For example, the inductive component may be a transformer or a single inductor. The inductive component may structurally include at least one winding and may be formed with an octagonal cross section, or extend laterally with an octagonal shape. The metallization layer that includes the inductive component may be different than the layers that include the non-inductive components and the grounded shield. For example, the metallization layer that includes the inductive component may be atop or formed above the metallization layers that include the grounded shield.

In operation 608, signals may be transmitted across the metallization layer with the grounded shield. As introduced above, a shielded inductive device may include an inductive component separated from non-inductive components by a grounded shield, all within the inductive footprint defined by the inductive component. By having the various circuit components of the device within the inductive footprint, routing distance between the circuit components and device size may be decreased. Also, by routing across the layer that includes the grounded shield, the quality factor of the inductive component may be maintained and comparable with quality factors of devices with inductive components and non-inductive components not within an inductive footprint and/or separated by a grounded shield.

Figure 7:
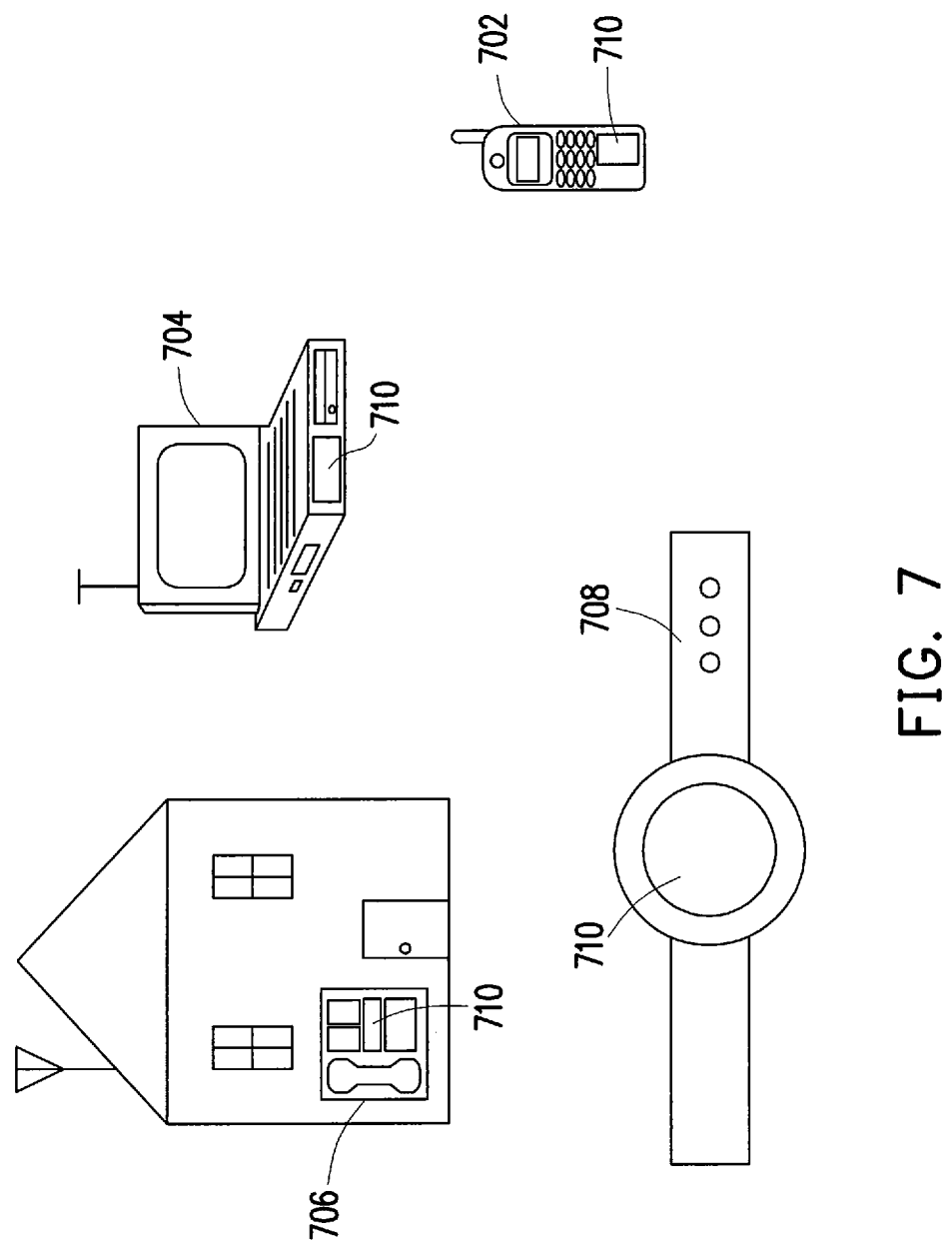
FIG. 7 illustrates various electronic devices that may be integrated with a shielded inductive device, in accordance with some embodiments.

FIG. 7 illustrates various electronic devices that may be integrated with a shielded inductive device, in accordance with some embodiments. For example, a mobile phone device 702, a laptop computer device 704, a fixed location terminal device 706, and a wearable device 708 may include a shielded inductive device 710 as described herein. The devices 702, 704, 706, 708 illustrated in FIG. 7A are merely exemplary. Also, each electronic device may implement shielded inductive devices in various manners as desired for different applications in numerous embodiments. For example, the mobile phone device 702, laptop computer device 704, wearable device 708, and/or fixed location terminal device 706 may include a cellular radio transceiver that may facilitate the sending and receiving of signals using an antenna. Such a transceiver may include, for example, an oscillator or an amplifier that may be used in function generators, phase locked loops, frequency synthesizers, and/or clock generators. Also, other electronic devices may also feature the shielded inductive device 710 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

In an embodiment, a circuit includes: a transformer defining an inductive footprint within a first layer; a grounded shield bounded by the inductive footprint within a second layer separate from the first layer; and a circuit component bounded by the inductive footprint within a third layer separate from the second layer, wherein: the circuit component is coupled with the transformer through the second layer, and the third layer is separated from the first layer by the second layer.

In another embodiment, a circuit includes: an inductor defining an inductive footprint within a first layer; a grounded shield bounded by the inductive footprint within a second layer separate from the first layer; and a circuit component bounded by the inductive footprint within a third layer separate from the second layer, wherein: the circuit component is coupled with the inductor through the second layer, and the third layer is separated from the first layer by the second layer.

In another embodiment, a method includes: forming a first layer with a circuit component bound within an inductive footprint; forming a second layer with a grounded shield bounded by the inductive footprint, the second layer separate from the first layer; and forming a third layer with an inductor that defines the inductive footprint, the third layer separated from the first layer via the second layer, wherein the circuit component is coupled with the inductor through the second layer.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module", or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A method, comprising:
    forming a first layer with a circuit component bound within an inductive footprint;
    forming a second layer with a grounded shield bounded by the inductive footprint, the second layer separate from the first layer; and
    forming a third layer with an inductor that defines the inductive footprint, the third layer separated from the first layer via the second layer, wherein the circuit component is coupled with the inductor through the second layer, wherein the circuit component comprises a transformer having at least two inductors.

2. The method of claim 1, further comprising transmitting signals across the second layer between the inductor and the circuit component.

3. The method of claim 1, further comprising forming additional circuit components within the first layer and bound within the inductive footprint.

4. The method of claim 3, further comprising transmitting signals across the second layer between the inductor and the additional circuit components.

5. The method of claim 1, wherein the inductor and the circuit component are part of a frequency synthesizer.

6. The method of claim 1, wherein a port of the inductor faces within winding structures of the inductor.

7. The method of claim 1, wherein the circuit component is part of an integrated fan out (InFO) package.

8. A method, comprising:
    forming an inductor defining an inductive footprint within a first layer;
    forming a grounded shield laterally bounded by the inductive footprint so as to be surrounded by an outer perimeter of the inductive footprint, wherein the grounded shield is formed within a second layer separate from the first layer; and
    forming a circuit component laterally bounded by the inductive footprint so as to be surrounded by an outer perimeter of the inductive footprint, wherein the circuit component is formed within a third layer separate from the second layer, wherein the inductor and the circuit component are part of a phase lock loop.

9. The method of claim 8, wherein the first layer, the second layer, and the third layer are metallization layers of an integrated circuit.

10. The method of claim 8, wherein the circuit component is a buffer, a divider, or a capacitor.

11. The method of claim 8, wherein the circuit component is an active device.

12. The method of claim 8, wherein the first layer is above the second layer and the third layer.

13. A method, comprising:
    forming an inductor defining an inductive footprint within a first layer;
    forming a grounded shield laterally bounded by the inductive footprint so as to be surrounded by an outer perimeter of the inductive footprint, wherein the grounded shield is formed within a second layer separate from the first layer; and
    forming a circuit component laterally bounded by the inductive footprint so as to be surrounded by an outer perimeter of the inductive footprint, wherein the circuit component is formed within a third layer separate from the second layer, wherein:
        the circuit component is coupled with the inductor through the second layer,
        the third layer is separated from the first layer by the second layer,
        the circuit component is laterally surrounded by winding structures of a transformer, and the first layer, the second layer, and the third layer are metallization layers of an integrated circuit.

14. The method of claim 13, wherein the inductor and the circuit component are part of a frequency synthesizer.

15. The method of claim 13, wherein a port of the inductor faces within winding structures of the inductor.

16. The method of claim 13, wherein the inductor and the circuit component are part of a phase lock loop that comprises an oscillator or an amplifier.

17. The method of claim 13, wherein the first layer comprises additional circuit components bound within the inductive footprint.

18. The method of claim 13, wherein the first layer is below the second layer and the third layer.

19. The method of claim 13, wherein the circuit component is an active device.

20. The method of claim 13, wherein the first layer, the second layer, and the third layer are metallization layers of an integrated circuit.

* * * * *